United States Patent [19]
Miyano et al.

[11] Patent Number: 5,957,371
[45] Date of Patent: Sep. 28, 1999

[54] METHOD AND APPARATUS FOR FORMING A BALL IN WIRE BONDING

[75] Inventors: Fumio Miyano, Akiruno; Kuniyuki Takahashi, Musashi Murayama, both of Japan

[73] Assignee: Kabushiki Kaisha Shinkawa, Tokyo, Japan

[21] Appl. No.: 08/953,758

[22] Filed: Oct. 17, 1997

[30] Foreign Application Priority Data

Oct. 17, 1996 [JP] Japan ................................. 8-295795

[51] Int. Cl.⁶ .................................................. H01L 21/60
[52] U.S. Cl. .................... 228/180.5; 228/4.5; 219/56.21; 219/56.22
[58] Field of Search ................. 228/4.5, 180.5; 219/56.21, 56.22

[56] References Cited

U.S. PATENT DOCUMENTS

| | | | |
|---|---|---|---|
| 4,594,493 | 6/1986 | Harrah et al. | 219/56.21 |
| 5,263,631 | 11/1993 | Felber | 228/4.5 |

FOREIGN PATENT DOCUMENTS

| | | | |
|---|---|---|---|
| 60-193352 | 10/1985 | Japan | 228/4.5 |
| H5-36748 | 2/1993 | Japan . | |
| H5-102233 | 4/1993 | Japan . | |
| H7-176560 | 7/1995 | Japan . | |
| H7-263480 | 10/1995 | Japan . | |

*Primary Examiner*—Patrick Ryan
*Assistant Examiner*—Jeffrey T. Knapp
*Attorney, Agent, or Firm*—Koda & Androllia

[57] ABSTRACT

In a fixed type discharge electrode system employed for forming a ball on a bonding wire, a magnet is provided on, for instance, the discharge electrode so as to apply a magnetic field that causes the portion of an electric spark facing the bonding wire to be bent and positioned beneath the bonding wire.

3 Claims, 4 Drawing Sheets

METHOD AND APPARATUS FOR FORMING A BALL IN WIRE BONDING

BACKGROUND OF THE INVENTION

1. Field of the Invention

The present invention relates to a method and apparatus for forming a ball on a bonding wire used in wire bonding and more particularly to a method and apparatus that applies a high voltage across the tip end of the wire and a discharge electrode so as to generate an electric discharge between them to form the ball on the bonding wire.

2. Prior Art

Discharge electrode systems employed in wire bonding include a fixed type discharge electrode system, in which the discharge electrode is positionally fixed, and a movable type discharge electrode system, in which the discharge electrode is moved by a solenoid, etc. The fixed type discharge electrode system is disclosed in, for example, Japanese Patent Application Kokai No. 7-263480; and the movable type discharge electrode system is disclosed in, for instance, Japanese Patent Application Laid-Open (Kokai) Nos. H5-36748, H5-102233 and H7-176560.

In the fixed type discharge electrode systems, a discharge electrode is positioned on one side of the tip end of the wire so that the electrode can be located as close as possible to the tip end of the wire with a space in between which can avoid contact with the wire when the capillary (which the wire passes through) is lowered.

In the movable type discharge electrode system, on the other hand, a discharge electrode is moved so as to be positioned directly beneath the tip end of the wire, and then an electric discharge is generated by the discharge electrode to form a ball on the wire. Thus in this system, the discharge electrode is retracted from beneath the capillary after the ball is formed.

In the fixed type discharge electrode systems, a driving means or control means which moves the discharge electrode is not required unlike the movable type discharge electrode system. As a result, the fixed type discharge electrode systems have a number of superior features. The overall weight of the bonding head can be reduced, high-speed operation is possible, the cost of the apparatus can be low and maintenance is easy.

In the movable type discharge electrode systems, the electric discharge is generated with the discharge electrode moved directly beneath the tip end of the wire. Accordingly, this system can form a ball so as not to be eccentric with respect to the center of the wire. On the other hand, though the fixed type discharge electrode systems have various advantages as described above, the electric discharge is performed with the discharge electrode positioned on one side of the tip end of the wire; accordingly, it is likely that eccentric balls or warped balls are formed. For this reason, the movable type discharge electrode systems are generally more widely used than the fixed type discharge electrode systems.

A ball formation by the fixed type discharge electrode system is shown in FIGS. 6 and 7.

As seen from FIG. 6, in the fixed type discharge electrode system, a discharge electrode 3 is positioned to one side of the tip end of a wire 2 which passes through a capillary 1. Accordingly, when the electric discharge occurs, discharge sparks 4a, 4b and 4c are, as shown in FIG. 7(a), discharged toward the wire 2 from the side of the wire 2; and therefore, the tip end of the wire 2 melts from the directions of the discharge sparks 4a, 4b and 4c. As a result, the formed balls 5a, 5b and 5c are eccentric or get warped as shown by the ball 5d in FIG. 7(b) which deviates from the center of the diameter of the wire 2.

In addition, if any contaminant adheres to the tip end of the discharge electrode 3, the electric discharge generates from the side surface (upper surface in FIG. 7(a)) of the discharge electrode 3 as shown by the discharge spark 4c. In such a case, since the wire 2 begins to melt not from the tip end but from the position of the ball 5c, the wire 2 is cut at an intermediate point before a ball is formed, or an extremely small ball is formed on the wire 2. Even if the wire 2 is not cut at an intermediate point, a ball with a distorted shape such as that shown in FIG. 7(c) at 5e tends so be formed. This problems leads to an in ball diameter.

Accordingly, the object of the present invention is to provide a method and apparatus in a fixed type discharge electrode system that forms a ball on a bonding wire without causing any deviation from the center of the wire and distorted shape and further provides a constant diameter on the formed balls.

The method of the present invention which accomplishes the object is characterized by the fact that in a ball formation method used in wire bonding in which a discharge electrode is positioned beside the tip end of a wire and a ball is formed on the tip end of the wire by applying a high voltage across the tip end of the wire and the discharge electrode so as to cause an electric discharge to occur, a magnetic field is applied to the discharge spark, thus causing the portion of the discharge spark that faces the wire to be curved and positioned beneath the wire.

The apparatus of the present invention which accomplishes the object is characterized by the fact that in a ball formation apparatus used in wire bonding in which a discharge electrode is positioned beside the tip end of a wire, and a ball is formed on the tip end of the wire by applying a high voltage across the tip end of the wire and the discharge electrode so as to generate an electric discharge, a magnet is provided so as to apply a magnetic field that bends the portion of the discharge spark facing the wire and locates such a portion of the discharge spark beneath the wire.

DETAILED DESCRIPTION OF THE INVENTION

One embodiment of the present invention will be described with reference to FIGS. 1 through 4.

Figure 1:
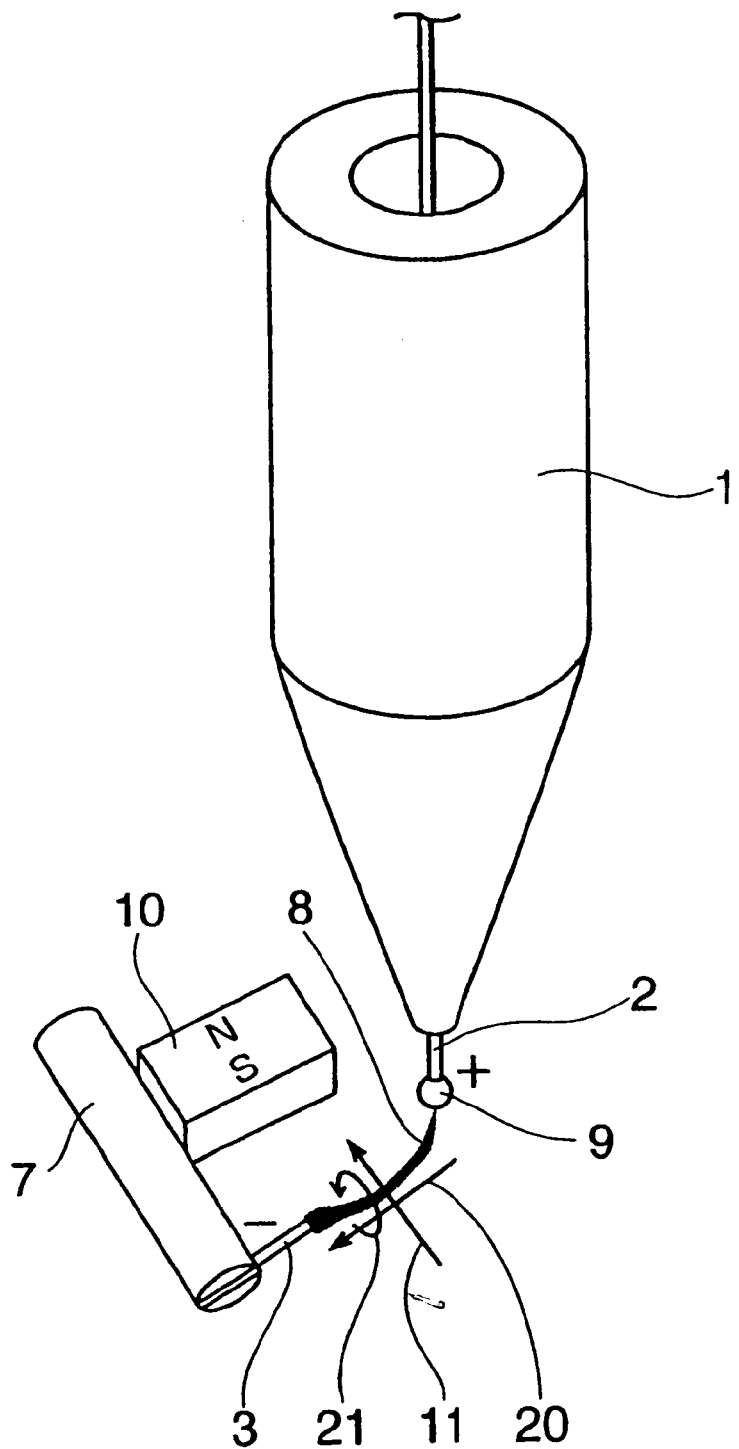
FIG. 1 is a schematic explanatory diagram which illustrates one embodiment of the present invention.
Figure 2:
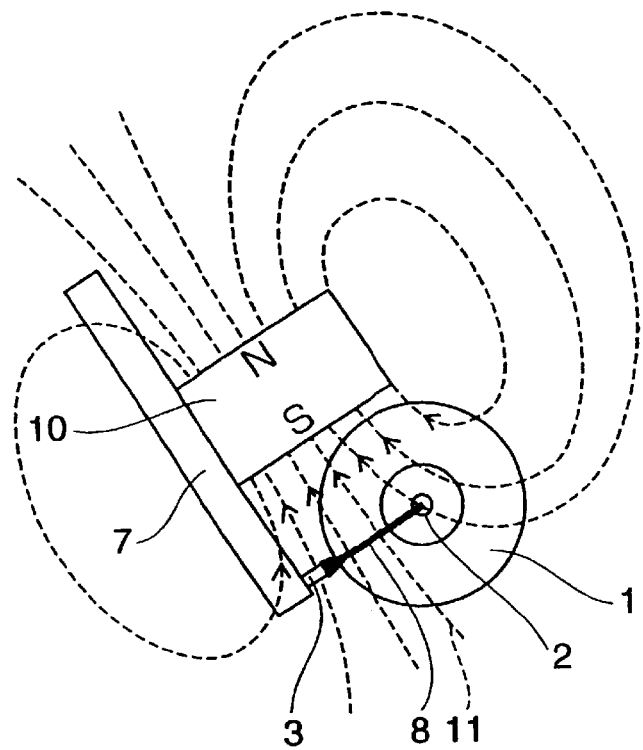
FIG. 2 is an explanatory plan view illustrating the magnetic field of the magnet used in the present invention.

As shown in FIGS. 1 and 2, a magnet 10, which is a permanent magnet or an electromagnet, is attached to a discharge rod 7 to which a discharge electrode 3 is attached, so that a magnetic field 11 is applied by the magnet 10 to the gap between the tip end of the wire 2 and the discharge electrode 3. In other words, the magnetic field 11 is applied to the discharge spark 8 by the magnet 10. In this case, if an electric discharge is generated with the wire 2 acting as a +(positive) electrode and the discharge electrode 3 acting as a −(negative) electrode, the magnet 10 is arranged so that the side that faces the discharge electrode 3 is an S pole and so that the opposite side is an N pole.

Accordingly, the magnetic field 11 created by the magnet 10 is oriented from the N pole to the S pole as best seen from FIG. 2; and when a discharge spark 8 is generated, an electric current 20 flows from the wire 2 toward the discharge electrode 3, so that a counterclockwise magnetic field 21 is generated around the electric current 20 (as seen from the side of the discharge electrode 3). The magnetic field 11 created by the magnet 10 acts on the magnetic field 21 created by the electric current 20, so that the current 20, i.e., the discharge spark 8, is curved downward, thus causing the portion of the discharge spark 8 that faces the wire 2 to be positioned beneath the wire 2.

The action of the magnetic field 11 created by the magnet 10 on the magnetic field 21 created by the current 20 will be described below with reference to FIGS. 3 and 4.

On the upper side of the current 20, the magnetic field 11U (magnetic flux 12U) generated by the magnet 10 and the magnetic field 21U (magnetic flux 22U) generated by the current 20 are oriented in the same direction; therefore, these magnetic fields repel each other, and a repulsive force 30 is generated. On the lower side of the current 20, the magnetic field 11U (magnetic flux 12U) generated by the magnet 10 and the magnetic field 21U (magnetic flux 22U) generated by the current 20 are oriented in directions which result in mutual cancellation; therefore, these magnetic fields attract each other, and an attractive force 31 is generated. Because of the repulsive force 30 on the upper side of the current 20 and the attractive force 31 on the lower side of the current 20, a force 32 which pushes the current 20 downward is generated; and as a result, the current 20 is caused to curve downward by this force 32, and the discharge spark 8 shown in FIG. 1 curves downward so that the portion of the discharge spark 8 that faces the wire 2 is positioned beneath the wire 2.

Figure 5A:
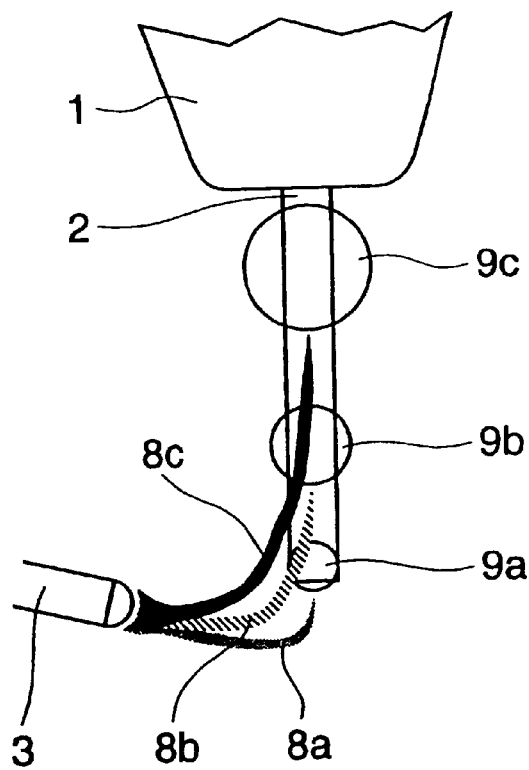
FIG. 5(a) is an explanatory diagram which illustrates the ball formation.
Figure 5B:
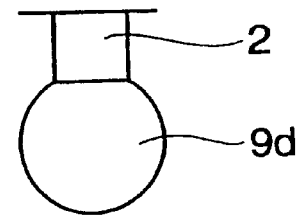
FIG. 5(b) is an explanatory diagram which shows the ball that is formed.
Figure 6:
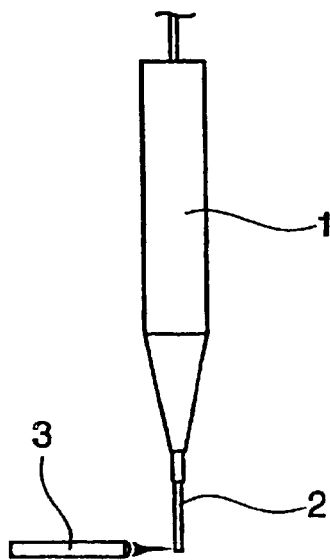
FIG. 6 is a schematic explanatory diagram which illustrates a conventional ball forming method.
Figure 7A:
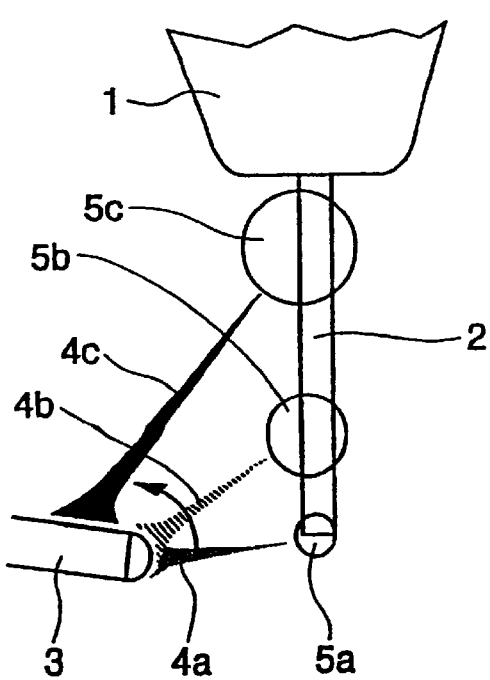
FIG. 7(a) is an explanatory diagram which illustrates conventional ball formation.
Figure 7B:
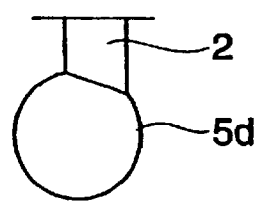
FIGS. 7(b) and 7(c) are explanatory diagrams which show balls that are formed.
Figure 7C:
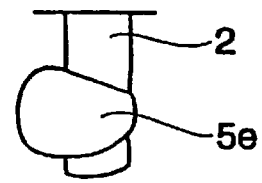

In other words, as shown in FIG. 5(*a*), the shapes of the discharge sparks 8*a*, 8*b* and 8*c* can be made into a bent-shape so that the portions of the discharge sparks 8*a*, 8*b* and 8*c* that face the wire 2 are positioned beneath the wire 2. As a result, the balls 9*a*, 9*b* and 9*c* are formed when the wire 2 melts from directly beneath the wire 2 by the discharge sparks 8*a*, 8*b* and 8*c;* and as shown in FIG. 5(*b*), a ball 9*d*, which does not deviate from the center of the wire 2 and which does not have a distorted shape, is formed.

Figure 3:
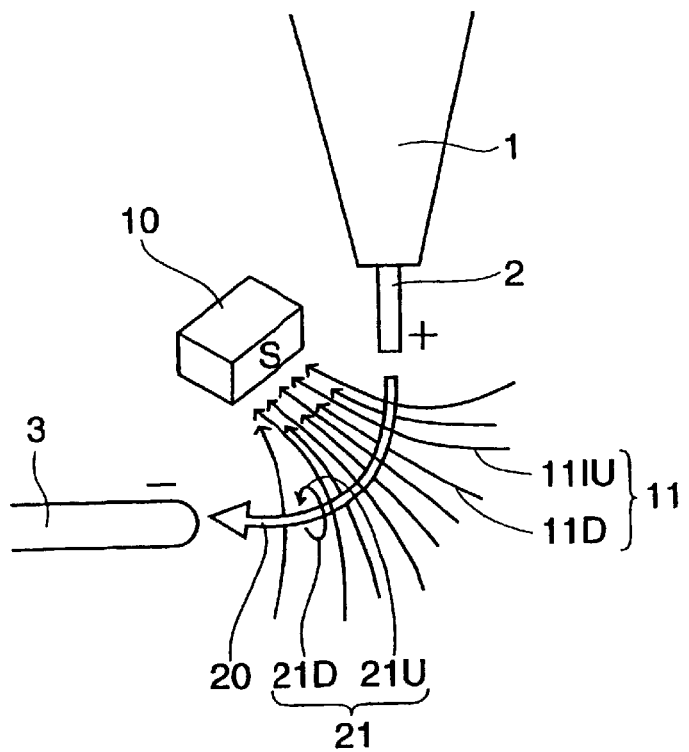
FIG. 3 is an explanatory diagram showing the magnetic fields of the magnet and current.
Figure 4:
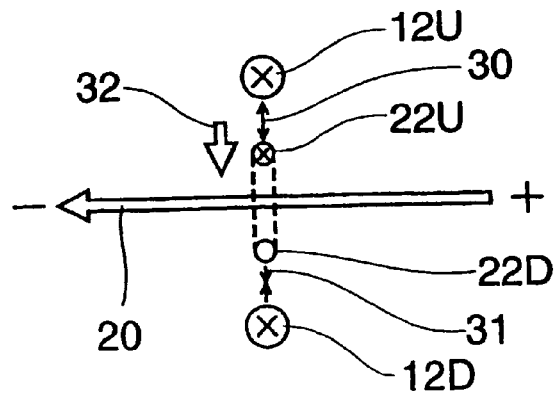
FIG. 4 is an explanatory diagram representing the principle of the force applied to the current.

Furthermore, as shown in FIG. 3, the electric current 20 which is bent by the magnetic field 11 generated by the magnet 10 flows toward the closest point on the discharge electrode 3, i.e., toward the tip end portion of the discharge electrode 3. Accordingly, the discharging position on the discharge electrode 3 can be constant, a stable electric discharge can be performed, and a ball diameter can be constant.

In the description above, the wire 2 is used as a positive electrode and the discharge electrode 3 as a negative electrode. However, the same effect is obtainable when the wire 2 is used as a negative electrode, the discharge electrode is used as a positive electrode, and the magnet 10 is installed so that the side facing the discharge electrode 3 is an N pole and the opposite side an S pole.

As seen from the above, according to the present invention, a magnetic field is applied to the discharge spark so that the portion of the discharge spark that faces the wire is curved downward. Accordingly, even in a fixed type discharge electrode system, a ball is formed without any deviation from the center of the wire and is free from a distorted shape, and the ball diameter can be stabilized.

We claim:

1. A method for forming a ball in wire bonding, wherein a high voltage is applied across a tip end of a wire and a discharge electrode, which is positioned beside said tip end of said wire, so as to generate an electric discharge and form said ball on said tip end of said wire, said method being characterized in that a magnetic field is applied to a discharged spark so as to cause a portion of said discharged spark that faces said wire to be curved and positioned beneath said wire.

2. An apparatus for forming a ball in wire bonding, wherein a high voltage is applied across a tip end of a wire and a discharge electrode, which is positioned beside said tip end of said wire, so as to generate an electric discharge and form said ball on said tip end of said wire, said apparatus being characterized in that a magnet is provided which applies a magnetic field which causes a portion of a discharged spark that faces said wire to be curved and positioned beneath said wire.

3. An apparatus according to claim 2, wherein said magnet is one selected from the group consisting of a permanent magnet and an electromagnet.

\* \* \* \* \*

UNITED STATES PATENT AND TRADEMARK OFFICE
CERTIFICATE OF CORRECTION

PATENT NO. : 5,957,371
DATED : September 28, 1999
INVENTOR(S) : Fumio Miyano, et al.

It is certified that error appears in the above-indentified patent and that said Letters Patent is hereby corrected as shown below:

In Claim 1:

Lines 1 and 2, change "wherein a high voltage is applied" to --comprising applying a high voltage--; and Lines 5 and 6, change "being characterized in that a magnetic field is applied" to --further comprising applying a magnetic field--.

In Claim 2:

Lines 2 and 3, change "wherein a high voltage is applied across a tip end of a wire and" to --comprising--;

Line 3, change "said" to --a--;

Line 4, change "said" to --a--;

change "so as to generate" to --for generating--;

change "and" to --to--; and

Line 6, change "being characterized in that a magnet is provided" to --further comprising a magnet--.

Signed and Sealed this

Twenty-fourth Day of October, 2000

Attest:

Q. TODD DICKINSON

*Attesting Officer*      *Director of Patents and Trademarks*